US009026954B2

(12) United States Patent
Perez et al.

(10) Patent No.: US 9,026,954 B2
(45) Date of Patent: May 5, 2015

(54) SURFACE TOPOGRAPHY ENHANCED PATTERN (STEP) MATCHING

(71) Applicant: GLOBALFOUNDRIES Singapore Pte. Ltd., Singapore (SG)

(72) Inventors: Valerio Barnedo Perez, Singapore (SG); Ushasree Katakamsetty, Singapore (SG); Wee Kwong Yeo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/157,530

(22) Filed: Jan. 17, 2014

(65) Prior Publication Data

US 2014/0282292 A1   Sep. 18, 2014

Related U.S. Application Data

(60) Provisional application No. 61/781,291, filed on Mar. 14, 2013.

(51) Int. Cl.
*G06F 17/50* (2006.01)
*G03F 1/36* (2012.01)

(52) U.S. Cl.
CPC ........................... *G03F 1/36* (2013.01)

(58) Field of Classification Search
CPC ....... G03F 1/84; G03F 1/144; G03F 7/70433; G03F 7/70441; G03F 7/705; G03F 7/70533; G03F 7/7065
USPC .......................................... 716/51, 52, 53, 54
See application file for complete search history.

(56) References Cited

U.S. PATENT DOCUMENTS

| | | | | |
|---|---|---|---|---|
| 6,893,800 | B2 * | 5/2005 | Jessen et al. | 430/311 |
| 8,024,675 | B1 * | 9/2011 | Gupta et al. | 716/54 |
| 8,079,005 | B2 * | 12/2011 | Lai et al. | 716/111 |
| 2007/0174793 | A1 * | 7/2007 | Watanabe | 716/1 |

* cited by examiner

*Primary Examiner* — Brian Ngo
(74) *Attorney, Agent, or Firm* — Horizon IP Pte Ltd (57) ABSTRACT

A design or lithographic enhancement process, a method for forming a device based on the lithographic enhancement process and a system for pattern enhancement are presented. The process includes processing a design data file. The design data file includes information of design layers in an integrated circuit (IC). Processing the design data file includes analyzing the design data file and patterns in the design data file are enhanced taken into consideration topography information of design layers corresponding to masks of the IC.

17 Claims, 4 Drawing Sheets

SURFACE TOPOGRAPHY ENHANCED PATTERN (STEP) MATCHING

CROSS-REFERENCE TO RELATED APPLICATION

This application claims the priority benefit of U.S. Provisional Application Ser. No. 61/781,291, filed on Mar. 14, 2013, which is herein incorporated by reference in its entirety.

BACKGROUND

Fabrication of devices involves the formation of features on a substrate that make up circuit components, such as transistors, resistors and capacitors. The components are interconnected, enabling the device to perform the desired functions. The components and interconnections are formed in numerous layers. Lithography is used to form patterns on the different layers. For example, an exposure source exposes a resist layer using a mask or reticle containing the desired patterns. The resist is developed after exposure, forming a resist mask with the pattern of the reticle. An etch is performed using the resist mask as an etch mask, transferring the pattern to the underlying layer or layers. Numerous masks may be used in the fabrication process of devices.

A mask may contain patterns which are lithographic weak points. Lithographic weak points impact the integrity of the pattern transfer process. The patterns which are weak points need to be enhanced or fixed so that the integrity of the pattern transfer process is not impacted. We have discovered that conventional pattern enhancement techniques are inadequate, particularly with advanced nodes.

Therefore, there is a desire to provide improved pattern enhancement to improve pattern transfer integrity.

SUMMARY OF THE INVENTION

Embodiments generally relate to a design or lithographic enhancement process, a method for forming a device based on the lithographic enhancement process and a system for pattern enhancement. In one embodiment, a design or lithography enhancement process is disclosed. The process includes processing a design data file. The design data file includes information of design layers in an integrated circuit (IC). Processing the design data file includes analyzing the design data file and patterns in the design data file are enhanced taken into consideration topography information of design layers corresponding to masks of the IC.

In another embodiment, a method of forming an integrated circuit is presented. The method includes providing a wafer having a substrate prepared with a photoresist layer. The photoresist layer is processed by passing a radiation from an exposure source of a lithography tool through a mask set generated based on an enhanced design data file. The enhanced design data file includes a design data file that is processed and analyzed. The design data file includes a modified artwork file of a device and this file includes design data of mask levels. Patterns in the design data file are enhanced or modified taken into consideration topography information of design layers corresponding to masks of the die. The method also includes developing the photoresist layer to transfer pattern on the mask set to the photoresist layer.

In yet another embodiment, a process for enhancing a design file for lithography is disclosed. The process includes processing a design data file. The design data file includes information of design layers in an integrated circuit (IC). Patterns in the design data file are enhanced taken into consideration topography information of design layers corresponding to masks of the IC. The process includes generating an enhanced design data file.

In another embodiment, a system for pattern enhancement for an integrated circuit is presented. The system includes a topography analysis module. The topography analysis module analyses a design data file containing information of design layers in an IC to determine accumulated topography information of the design layers. The system also includes a pattern analysis module and a classification module. The pattern analysis module analyzes design layers to identify lithography weak patterns (matched weak lithography patterns) matching known weak lithography patterns while the classification module classifies matched lithography weak patterns into priority classifications based on the accumulated topography information of the design layer. The system further includes a pattern enhancement module for fixing lithography weak patterns based on their priority classifications.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to devices, for example, semiconductor devices or integrated circuits (ICs). The ICs can be any type of IC, such as dynamic or static random access memories, signal processors, microcontrollers or system-on-chip (SoC) devices. The devices or ICs can be incorporated into or used with, for example, consumer electronic products, such as computers, cell phones, and personal digital assistants (PDAs).

Figure 1:
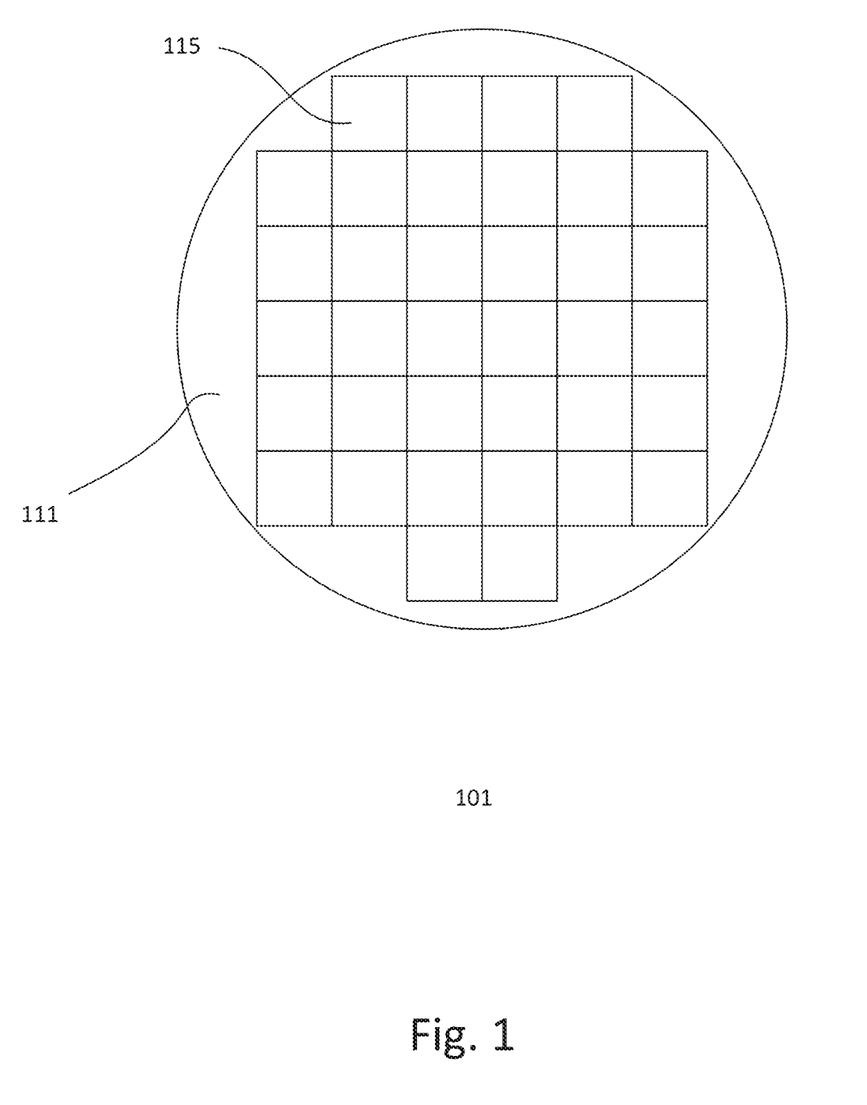
FIG. 1 shows a semiconductor wafer.

FIG. 1 shows a semiconductor wafer 101. The semiconductor wafer, for example, may be a silicon wafer. Other types of wafers are also useful. For example, the wafer may be a p-type, n-type, silicon-on-insulator or silicon germanium wafer. The wafer may include a notch (not shown) to indicate the crystal orientation of the wafer. Other techniques for indicating the crystal orientation may also be useful. Additional indicators may also be included to indicate the dopant type of the wafer.

The wafer includes an active surface 111 on which devices 115 are formed. A plurality of devices or dies may be formed on the wafer in parallel. The devices, for example, are arranged in rows along a first (x) direction and columns along a second (y) direction. The devices are subsequently singulated into individual dies, assembled and tested. In other embodiments, the wafer may include a single device.

The fabrication of devices, such as integrated circuits (ICs), involves the formation of features on a substrate that make up circuit components, such as transistors, resistors and capacitors. The devices are interconnected, enabling the device to perform the desired functions. Interconnections are formed by forming contacts and conductive lines in a dielectric layer using, for example, damascene techniques. The device features and interconnections are formed by repeatedly depositing and patterning layers on the wafer. Patterning, for example, includes lithography. For example, lithography includes exposing of a resist layer on the wafer (may or may not include one or more device layers) with an exposure source through a reticle or mask with a reticle pattern, development of the resist to transfer the reticle pattern to the resist, and etching, such as a reactive ion etch (RIE), to transfer the resist pattern to the wafer.

In forming ICs, numerous masks or reticles are used. For example, a mask set having numerous masks is used. Lithography is performed to transfer the reticle or mask pattern onto a resist layer. The patterned resist may be used for various purposes to create features on the substrate. For example, the patterned resist may be used as an implant or etch mask. In the case of implant mask, doped regions are formed in the substrate while an etch mask is used to form features on the wafer.

Planarization process, such as chemical mechanical polishing (CMP) process, may be performed. For example, CMP may be performed for planarization of, for example, dielectric and metal layers. Performing CMP on other types of layers may also be useful. The CMP process should provide a planar surface, both globally across the wafer as well as locally across a die. However, due to pattern density and line width variations in design as well as other processing issues, CMP does not always produce a planar surface. CMP, for example, may introduce planarity changes, surface topography changes, dishing and erosion, among others.

The information of the mask set or design layers may be provided in or contained in a design data file. For example, the layout or mask information of the masks used in the fabrication of an IC is provided in a design data file. A mask set may be ultimately created based on the design data file. The design data file may be an artwork file, containing information of the IC, such as the layout of the features of the various masks of the mask set. The design data file, for example, can be a GDSII format file. Providing design data files in other formats may also be useful. For example, the design data file may be in an OASIS format or place and route databases, including open access or Milkyway from Synopsys, may also be useful.

Figure 2:
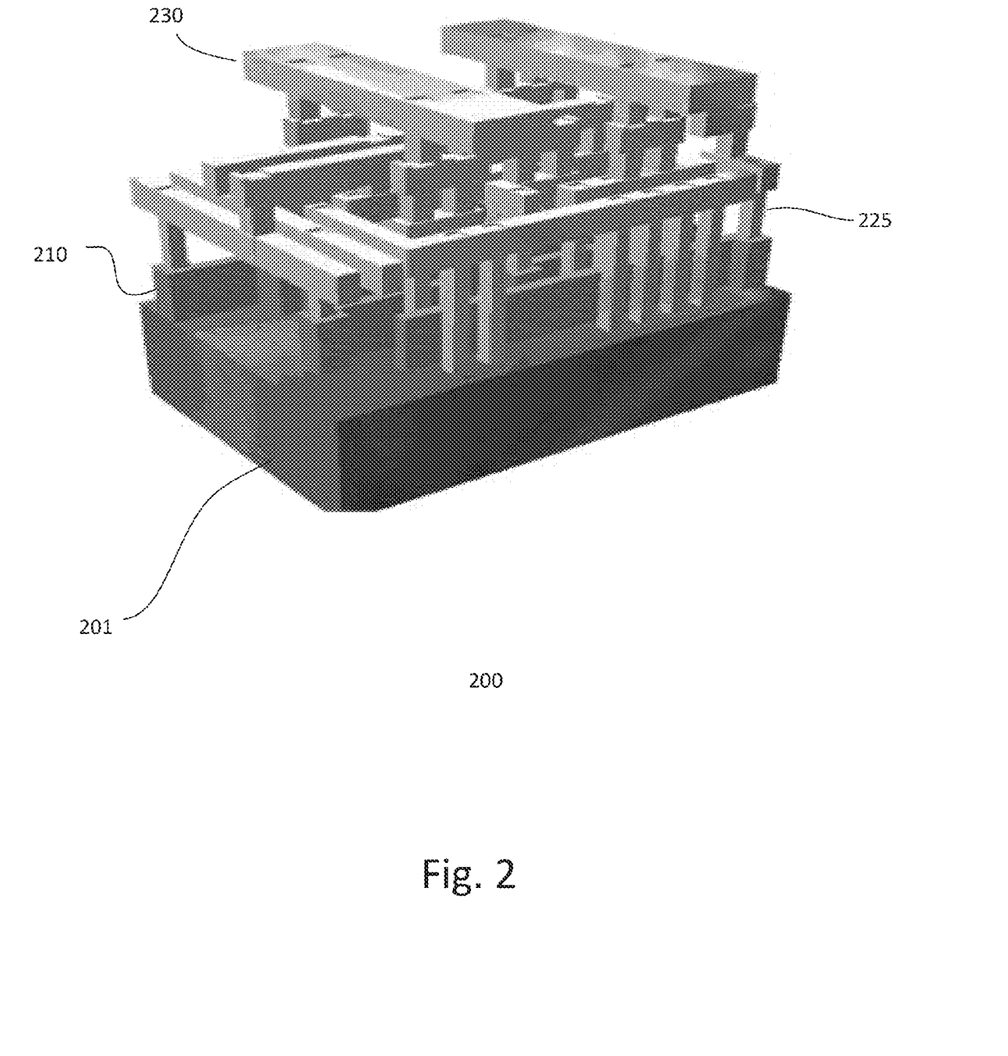
FIG. 2 shows a 3-dimensional view of an exemplary portion of a device in GDSII format.

FIG. 2 illustrates a 3-dimensional view of an exemplary portion of a device 200 in GDSII format. The portion, for example, may be a cell of a device. The view (e.g., GDSII view) shows a substrate 201 with a patterned polysilicon layer 210 which forms polysilicon lines. The polysilicon lines, for example, represent gate electrodes of transistors. Three metal layers 230 are provided in the cell. Providing other number of metal layers may also be useful. The metal layers are coupled to the substrate and gates by contacts represented by posts 225. Other types of levels may also be useful.

A mask set is provided to form an IC. To form a plurality of ICs in parallel on the wafer, the lithographic system repeatedly exposes the wafer with the reticle, which corresponds to a plurality of ICs. After completion of processing the wafer, it is diced to singulate the plurality of ICs.

In the design process, different parties, groups or entities may be involved in the development to complete the full device. For example, a first party may develop a plurality of IP modules. The first party, for example, is an IP provider. For example, the IP provider may be a foundry. Other types of IP or service providers may also be useful.

A module, for example, contains circuitry for performing a specific function. The complete layout information of a module is contained in an artwork file. For example, the artwork file contains component layout, interconnects, pin definitions and pin labels. The artwork file, for example, may be a GDSII file. Providing artwork files in other formats may also be useful. Different modules may be provided to perform different functions. The different modules, for example, are contained in respective artwork files.

The modules may be provided to a second party for use in designing a full device or chip. The second party, for example, may be an end user or customer which designs the full chip according to the available modules. Such end user may be an IC design company. For example, modules may be selected and combined, including interconnections according to the desired functions. The design and layout of the IC may be merged into a single artwork file. In other embodiments, a full chip may be provided in a single artwork file. For example, the full chip may have options for which the second party may select to perform the desired functions.

The design file containing the design data may be enhanced for lithography. For example, lithography enhancements may be performed on the design data. The patterns of the design data may have lithographic pattern weak points. For example, some patterns on the mask may not be accurately printed on the wafer. Weak points may occur due to, for example, feature miniaturization in advanced nodes, narrowing of lithography exposure window and process variations. Lithographic enhancements on the design data is to correct or fix the lithographic weak points in the patterns early in the design process. The lithographic enhancements are performed by the second party, such as the IC design company. The enhanced design data may be provided to the first party, such as the foundry. Enhancements may be performed on an electronic design automation (EDA) tool. EDA tools may include analog or mixed signal custom layout generation tools as well as digital place and route tools, such as those from, for example, Synopsys, Cadence or Mentor Graphics. Other types of EDA tools may also be useful.

Figure 3:
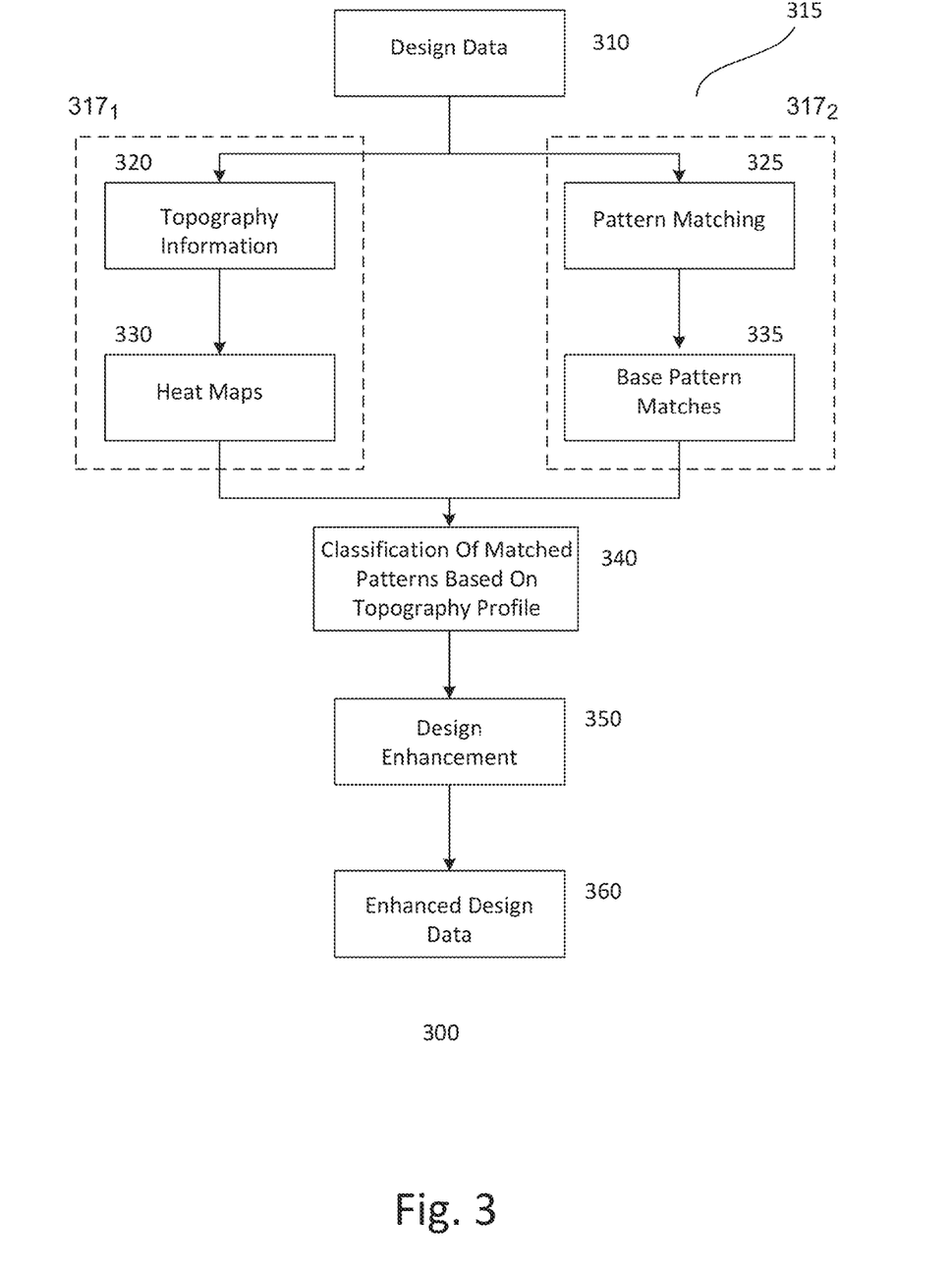
FIG. 3 shows an embodiment of process enhancement of a design file of a device.

FIG. 3 shows an embodiment of a design or lithographic enhancement process 300. The enhancement process, for example, may be performed by an EDA tool. As shown, a design data file is provided at step 310. The design data file, for example, is an artwork file of a device. The artwork file includes the layout of the device at the various mask levels. For example, a mask set with numerous masks for fabricating an IC is derived from the artwork file. The artwork file may be a GDSII format file. Other types of design data files, such as place and route databases, including open access or Milkyway, may also be useful.

The process performs initial analysis of the design data at step 315. The initial analysis includes first and second analyses $317_{1-2}$. The first analysis $317_1$ includes a topography analysis at step 320. The topography analysis determines topography information of the design layers corresponding to the masks of the IC or device. For example, a design layer is a layer on which a resist layer is formed. A design layer may be a bare wafer or one or more layers on a wafer. The resist layer is exposed using a mask of the mask set. In the process to form the device, there may be x design layers. The x design layers are exposed by masks of the mask set. For example, a design layer is associated with a mask. Each time a mask is used, it may be referred to as a mask level. For example, x design layers correspond to x mask levels. In some instances, a mask of a set may be reused for another layer. For example, a mask may be used for more than one mask levels or design layers. In such case, even though it may be the same mask, the layers or levels are different. In other words, a mask set may have less than x masks used for x design layers.

The topography analysis, in one embodiment, determines accumulated topography information of the design layers or mask levels of the device. For example, the topography analysis determines accumulated topography information of each design layer of the device, such as from layer 1 to layer x. In one embodiment, the topography analysis determines accumulated topography information of topography affected design layers or mask levels, such as from layer 1 to layer T of the T topography affected design layers or mask levels.

A simulation may be performed using a silicon calibrated CMP model to determine accumulated topography information of a layer. The simulation, for example, generates topography profile of the layers. The CMP model may be provided by the foundry to the IP provider or SoC designers. For example, the CMP model may be provided by the foundry based on actual CMP information. Other techniques for obtaining the CMP model may also be useful.

The CMP simulation generates topography profile for the die at different mask levels. The CMP simulation generates topography profile for each mask level. In one embodiment, the CMP simulation generates topography profile for topographically affected mask levels. For example, the CMP simulation generates topography profile for each topographically affected mask level. The topography profile is the profile of the actual surface variations on the wafer or design layer after CMP for the exposed mask layer. The topography profile, in one embodiment, is an accumulated topography profile. For example, an accumulated topography profile of a design layer associated with the $n^{th}$ mask level includes the topography effects of the layers up to the $n^{th}$ level, where n is from 1 to x or from 1 to T.

The die of a mask level are categorized based on its height relative to a nominal or baseline height. For example, regions on the die of a mask level are categorized based on its height relative to the nominal height. The classification, for example, is based on the topographical height in each region relative to the baseline height. In one embodiment, the regions are classified into 5 categories. Providing other number of categories or classification granularities may also be useful. The categories are shown in table 1 below:

TABLE 1

| Classifications |
| --- |
| Critically High Region |
| High Region |
| Medium Region |
| Low Region |
| Critically Low Region |

In one embodiment, at step 330, heat maps are generated for the different mask levels. For example, heat maps are generated for each simulated mask level. A heat map is a color-coded map of the die based on topography classifications. Table 2 below shows an exemplary color code for topography classifications:

TABLE 2

| Classifications | Color Code |
| --- | --- |
| Critically High Region | Red |
| High Region | Dark Yellow |

TABLE 2-continued

| Classifications | Color Code |
| --- | --- |
| Medium Region | Bright Yellow |
| Low Region | Green |
| Critically Low Region | Blue |

Using other colors to represent different classifications may also be useful. Preferably, the colors should be easily distinguishable from each other. Other techniques to represent different classifications may also be useful. Heat maps are graphical representation of accumulated topography profile of a die at different mask levels. This enables a user to easily identify potential problem areas on the die.

As for the second analysis $317_2$, it performs a pattern analysis. For example, at step 325, the second analysis $317_2$ matches patterns of the mask to known problems or base patterns. The base patterns, for example, are contained in a pattern library. The base patterns are known problem patterns or lithographic weak points. Such base patterns may be derived from historical data or information. In one embodiment, pattern matching is performed for a design layer associated with a mask level. For example, patterns of each design layer is analysed to determine which patterns match base patterns. Patterns on a layer which match base patterns are provided in a matched file. A layer may be systematically analyzed to ensure all patterns are processed. The analysis is repeated for processing other design layers. For example, the analysis is repeated for each design layer associated with a mask level.

In one embodiment, patterns of a design layer or mask level which match base patterns are stored in a matched file for the mask level at step 335. In one embodiment, each design layer is analysed to provide matched patterns in its respective layer matched file. For example, each pattern matched file contains a list of patterns of its respective layer which matches base patterns. The information contained in a pattern matched file includes the pattern identification and location of the pattern. For example, an entry in the list includes the type of pattern and its x-y coordinates on the die. Other types of information related to the pattern may also be included. For example, other information which identifies the pattern, such as necking or pinching patterns, may also be useful.

The process continues to enhance the design data file. Design enhancement includes enhancing matched patterns in the design data file. For example, the matched patterns of the different mask levels are enhanced. In one embodiment, design or pattern enhancement takes into account topography information from the topography analysis.

In one embodiment, design enhancement includes classifying matched patterns at step 340. For example, matched pattern classification is performed. In accordance with one embodiment, matched pattern classification includes classifying a matched pattern based on topography profile. As previously discussed, die regions are categorized based on its topography. A topography classification is assigned a weight value based on its height. Table 3 below shows an exemplary weighting of topography categories:

TABLE 3

| Classifications | Weight |
| --- | --- |
| Critically High Region | 5 |
| High Region | 3 |
| Medium Region | 1 |

TABLE 3-continued

| Classifications | Weight |
| --- | --- |
| Low Region | 2 |
| Critically Low Region | 4 |

The weighting value ranges from 1-5 for five classifications. Other weighting values may also be useful. The weightages may be defined by, for example, the foundry. In one embodiment, the higher the weight, the more critical the topography region. For example, higher priority is given to higher weighted regions for enhancement or fix. More effort or higher priority may be associated with more critical topography regions than less critical topography regions. For example, the fixes for higher weighted regions may require more effort and are assigned higher priority than those of lower weighted regions. As shown, a critically high region is given the highest weight while a medium region is given the lowest weight. Also, a high region is given a higher weight compared to a low region. Assigning weight values to the different regions may be determined by, for example, the foundry. Other weighting systems may also be useful.

A matched pattern is given a weight according to the type of region in which it is located. For example, the x-y coordinates of the matched pattern is used to determine the topography classification for weight assignment. Matched pattern classification is performed for all matched patterns in the matched pattern files. For example, pattern classification may be performed layer by layer or level by level.

At step 350, design enhancement is performed on the design data. In one embodiment, enhancement priority is based on matched pattern classification. For example, higher priority is given to a matched pattern with higher weighting value. The enhancement or type of fix may depend on the type of pattern and weighting value. For example, the patterns may be necking or bridging patterns. In some cases, a library may provide or contain possible fixes based on pattern classification and type of pattern. For example, the EDA tool may include suggestions of possible fixes. Once enhancement is completed, an enhanced design data file is generated at step 360. The enhanced design data file includes enhancements based on matched pattern classification. The enhanced design data file, for example, is a GDSII file. Other types of formats may also be useful for the enhanced design data file.

The enhancement may be performed automatically or semi-automatically by the EDA tool. For example, the EDA tool may be provided with a mode selector for a user to select to operate the EDA tool either in the automatic enhancement mode or the semi-automatic enhancement mode. In the automatic enhancement mode, the EDA tool performs fixes automatically based on weighting. For example, matched patterns with higher weighting are given higher priority. The type of fix may be pre-selected by the foundry. The type of fix may depend on the weighting. In the semi-automatic mode, a user may select the type of fix for a matched pattern based on weighting.

The second party, such as the IC design company, for example, submits the enhanced data file to the first party, such as the foundry. The first party processes the enhanced data file. For example, the first party may perform design rule check (DRC), optical proximity correction (OPC) and optical rule check (ORC) on the enhanced design data file. After processing, a mask set may be generated based on the processed design data file. The mask set is used to process wafers in the fabrication of ICs.

Figure 4:
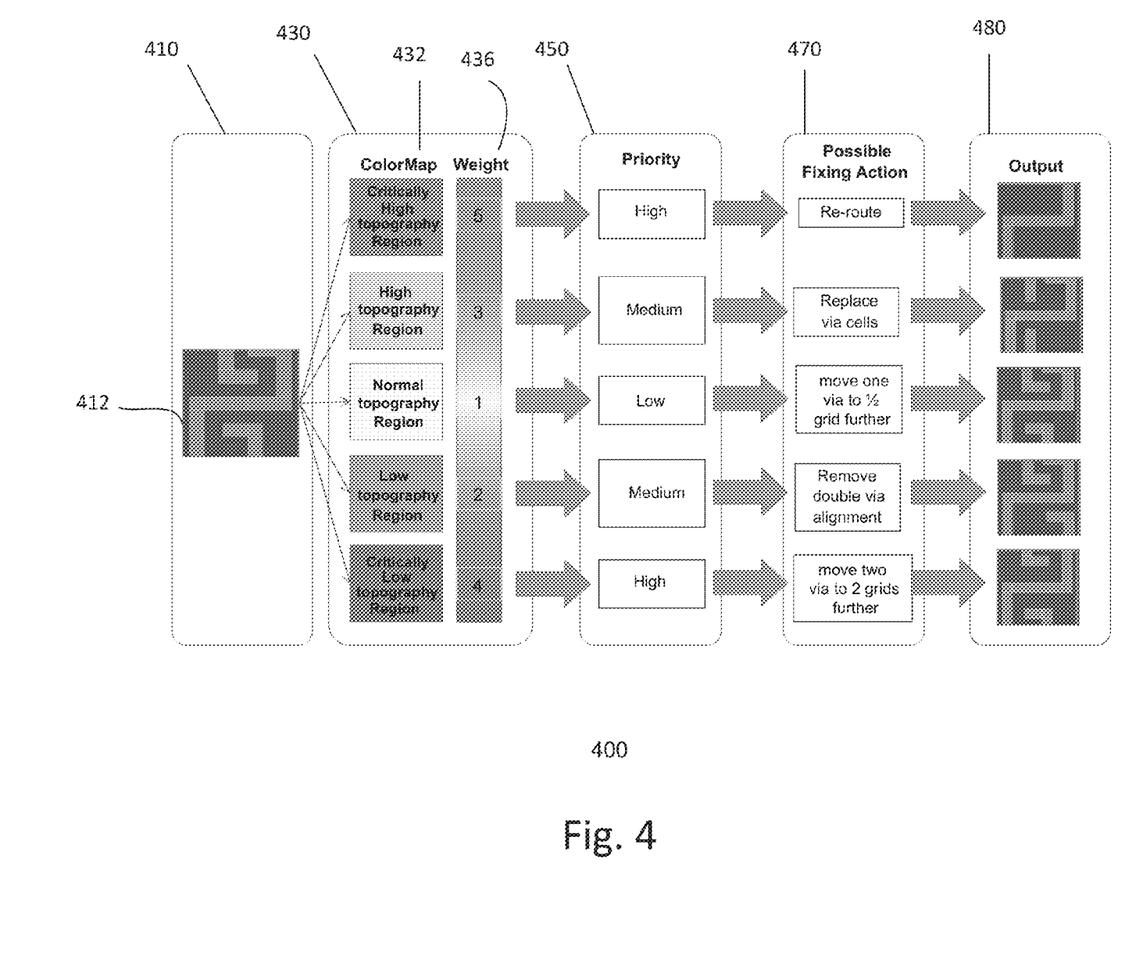
FIG. 4 shows an embodiment of an electronic design automation (EDA) environment for design enhancement.

FIG. 4 shows an embodiment of an EDA tool environment 400. The EDA tool includes various modules for performing topography classification and enhancements on design data. As shown, the EDA tool includes a pattern match module 410, a classification module 430, an enhancement summary module 450, an enhancement suggestion module 470 and an enhancement output module 480. Providing other or different modules may also be useful.

The pattern match module 410 displays patterns in the design file which match base patterns. For example, a matched pattern is displayed by the pattern match module 410. The matched pattern may be displayed one at a time. Other configurations of the pattern match module 410 may also be useful. For example, a user may select a matched pattern to display based on a list.

As shown, a pattern 412 is displayed. As for the classification module 430, it displays the weight classification of the selected pattern. In one embodiment, a color map corresponding to the topography classification is provided. For example, a color map 432 of the topography classification of the location of the selected pattern is displayed by the classification module 430. The weight value 436 of the selected pattern may also be displayed along with the color map. Other techniques for displaying or conveying the classification of the selected pattern may also be useful.

Based on the classification, the enhancement summary module 450 provides the user with information related to priority of the enhancement. Enhancement priority is based on the topography of the area in which a matched pattern is located. For example, the enhancement priority depends on the topography classification. In one embodiment, enhancement priority is related to weight value. For example, the higher the weight value, the higher the enhancement priority. As shown, weight values 4 and 5 have a high enhancement priority, weight values 2 and 3 have medium enhancement priority and weight value 1 has a low enhancement priority. Other enhancement classifications may also be useful. For example, matched patterns with higher enhancement priority are repaired or fixed before those with lower enhancement priority.

The enhancement suggestion module 470 may provide possible enhancements. The possible enhancements may depend on the enhancement priority level. Various factors, such as wiring congestion, timing constraints and design constraints, may determine the type of enhancements. For example, possible enhancements may include re-routing, replacing cells and relocating cells. Other types of enhancements may also be useful. The type of enhancement may depend on the priority level. For example, the higher the priority level, the more that is required to be changed with respect to the design data. The enhancement output module 480 provides a graphical representation of the enhancement.

The EDA tool may automatically provide enhancements based on weight. For example, the enhancement may be performed by the EDA tool without input from the user. The enhancements are performed based on, for example, weight and other factors. In such case, the output module displays the fix rendered by the EDA tool. Alternatively, the EDA tool may provide semi-automatic enhancements based on weight. The tool may provide suggested solutions for selection by the user. In some cases, the user may determine the type of fix to implement based on available fixes. Other configurations of the EDA tool may also be useful.

As described, lithography weak point pattern matching takes into account topography profile of the wafer surface. For example, lithography pattern matching is aware of topography profile (topography aware lithography analysis). The topography profile may be categorized and represented by colored heat maps. A color or category represents a topographical bin level, which is translated into weighting values added to the matched lithography patterns. The amount of fixing effort for a matched lithography pattern depends on its weight value. For example, the amount of fixing effort is customized to the topography profile of each area. This enables both lithography and CMP weak points (hot spots) to be detected and corrected at the layout design stage, improving design robustness during manufacturing.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A process for enhancing a design file for generating a mask set having a plurality of masks used in lithographic processes to form a semiconductor device on a wafer, the process comprising:
   processing a design data file, the design data file comprises information of design layers, wherein a design layer is used for generating a mask of the mask set, the information includes patterns of the design layers, wherein processing the design data file comprises
      analyzing using a topography analysis module, the patterns of the design layers of the design data file comprising
         performing a first analysis, wherein the first analysis comprises a topography analysis to determine accumulated topography information, wherein accumulated topography information comprises topography information of wafer which includes underlying topography information of the wafer processed by masks of underlying design layers, wherein regions of design layers are categorized according to a topography classification which is based on topographical height in each region relative to a baseline height, and
         performing a second analysis, wherein the second analysis comprises a pattern analysis which comprises matching patterns of the masks to base patterns; wherein matching patterns comprises classifying the matched patterns based on the topography profile, wherein the matched pattern is assigned a weight value according to type of topography profile or region and
      enhancing using a pattern enhancement module, patterns of the design layers in the design data file based on the first and second analyses.

2. The process of claim 1 wherein the topography analysis comprises performing a simulation using a chemical mechanical polishing (CMP) model to generate topography profile for the device on the wafer which is processed by different mask levels.

3. The process of claim 2 comprising generating heat maps for each simulated mask levels, wherein the heat map is a color-coded map of the device based on the topography classification.

4. The process of claim 2 wherein the base patterns comprise known problem patterns or lithographic weak points.

5. The process of claim 2 comprising storing information related to a matched file, wherein the information comprises type of patterns of a design layer which match the base patterns and location of the patterns in its x-y coordinates on the device.

6. A process for enhancing a design file for generating a mask set having a plurality of masks used in lithography to form an integrated circuit (IC) on a wafer comprising:
   processing a design data file, the design data file comprises information of design layers, the information includes patterns of the design layers, wherein processing the design data file comprises
      analyzing using a topography analysis module, the design data file, wherein analyzing comprises
         performing a first analysis, wherein the first analysis comprises a topography analysis to determine accumulated topography information of the design layers or mask levels of the IC, wherein regions on the IC of mask levels are categorized according to a topography classification which is based on topographical height in each region relative to a baseline height, and
         performing a second analysis, wherein the second analysis comprises a pattern analysis which comprises matching patterns of the mask to base patterns;
   storing information related to a matched file, wherein the information comprises type of patterns of a design layer which match the base patterns and location of the patterns in its x-y coordinates on the IC; and
   enhancing using a pattern enhancement module, matched patterns in the design data file, wherein the step of enhancing comprises
      classifying the matched patterns based on the topography profile, wherein a matched pattern is assigned a weight value according to type of topography profile or region; and
   fixing the matched patterns based on enhancement priority rules, wherein the enhancement priority rules depend on type of pattern and the weight value.

7. The process of claim 6 wherein topography region which is a high region is assigned with a higher weight value relative to topography region which is a low region.

8. The process of claim 7 wherein the enhancement priority rules are defined in that higher priority is given to a matched pattern with higher weight value.

9. The process of claim 6 comprising generating an enhanced design data file after the step of enhancing the patterns.

10. The process of claim 9 wherein the step of enhancing the patterns is performed by a first party and the enhanced design data file is used to generate the mask set which is used by a second party for device fabrication.

11. The process of claim 10 wherein the first party comprises a device designer and the second party comprises a foundry.

12. A method of forming an integrated circuit device comprising:
   providing a wafer having a substrate prepared with a photoresist layer;
   processing the photoresist layer by passing a radiation from an exposure source of a lithography tool through a mask of a mask set generated based on a modified design data file, wherein the modified design data file comprises a design data file that is processed and analyzed using a topography analysis module, the design data file includes a modified artwork file of a device, wherein the file comprises design data for patterns of mask levels, and patterns in the design data file are enhanced or modified based on analysis comprising
  a first analysis, wherein the first analysis comprises a topography analysis to determine accumulated topography information, wherein accumulated topography information comprises topography information of wafer which includes underlying topography information of the wafer processed by masks of underlying design layers, wherein regions of design layers are categorized according to a topography classification which is based on topographical height in each region relative to a baseline height, and
  a second analysis, wherein the second analysis comprises a pattern analysis which comprises matching patterns of the masks to base patterns wherein matching patterns comprises classifying the matched patterns based on the topography profile, wherein the matched pattern is assigned a weight value according to type of topography profile or region; and
developing the photoresist layer to transfer pattern on the mask set to the photoresist layer.

13. A process for modifying a design file for lithography comprising:
providing a design data file using a computer, the design data file comprises information for patterns of design layers in an integrated circuit (IC);
enhancing using a pattern enhancement module, patterns in the design data file based on an analysis, wherein the analysis using a topography analysis module, comprises
  a first analysis, wherein the first analysis comprises a topography analysis to determine accumulated topography information, wherein accumulated topography information comprises topography information of wafer which includes underlying topography information of the wafer processed by masks of underlying design layers, wherein regions of design layers are categorized according to a topography classification which is based on topographical height in each region relative to a baseline height, and
  a second analysis, wherein the second analysis comprises a pattern analysis which comprises matching patterns of the masks to base patterns wherein matching patterns comprises classifying the matched patterns based on the topography profile, wherein the matched pattern is assigned a weight value according to type of topography profile or region; and
generating an enhanced design data file.

14. The process of claim 13 wherein:
the topography analysis comprises performing a simulation using a chemical mechanical polishing (CMP) model to generate topography profile for the IC at different mask levels; and
generating heat maps for different mask levels, wherein the heat map is a color-coded map of the IC based on the topography classification.

15. The process of claim 14 wherein the pattern analysis comprises matching patterns of the mask to base patterns.

16. A process for enhancing a design file for generating a mask set having a plurality of masks used in lithography to form an integrated circuit (IC) on a wafer comprising:
processing a design data file, the design data file comprises information of design layers in an integrated circuit (IC), the information includes patterns of the design layers, wherein processing comprises
  performing a topography analysis using a topography analysis module, on the design data file, the topography analysis comprises performing a simulation using a chemical mechanical polishing (CMP) model to generate topography profile for the IC at different design layers or mask levels and regions on the IC of the mask levels are categorized according to a topography classification which is based on topographical height in each region relative to a baseline height; and
  performing a pattern analysis on the design data file, the pattern analysis comprises matching patterns of the design layers to base patterns;
generating heat maps for different mask levels, wherein the heat map is a color-coded map of the IC based on the topography classification; and
enhancing using a pattern enhancement module, patterns in the design data file, wherein enhancing comprises
  classifying the matched patterns based on the topography profile, wherein the matched pattern is assigned a weight value according to type of topography profile or region, and
  fixing the matched patterns based on enhancement priority rule, wherein the enhancement priority rule depends on type of pattern and the weight value; and
generating an enhanced design data file.

17. A system for pattern enhancement of a design data file containing information patterns for an integrated circuit (IC) which is used to generate a mask set having a plurality of masks used to manufacture the IC, the system comprising:
a topography analysis module, the topography analysis module analyzes the design data file containing pattern information of design layers in an IC to determine accumulated topography information of the design layers, wherein regions of design layers are categorized according to a topography classification which is based on topographical height in each region relative to a baseline height;
a pattern analysis module, the pattern analysis module analyzes design layers to identify lithography weak patterns (matched weak lithography patterns) matching known weak lithography patterns wherein the matched weak lithography pattern is assigned a weight value according to type of topography information or region;
a classification module, the classification module classifies matched lithography weak patterns into priority classifications based on the accumulated topography information of the design layer; and
a pattern enhancement module for fixing lithography weak patterns based on their priority classifications.

* * * * *